(12) United States Patent
Wu et al.

(10) Patent No.: US 10,608,142 B2
(45) Date of Patent: Mar. 31, 2020

(54) METHOD OF MAKING A LIGHT EMITTING DEVICE HAVING A PATTERNED PROTECTIVE LAYER

(71) Applicant: EPISTAR CORPORATION, Hsinchu (TW)

(72) Inventors: Jar-Yu Wu, Hsinchu (TW); Ching-Jang Su, Hsinchu (TW); Chun-Lung Tseng, Hsinchu (TW); Ching-Hsing Shen, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 153 days.

(21) Appl. No.: 15/703,649

(22) Filed: Sep. 13, 2017

(65) Prior Publication Data

US 2018/0013038 A1 Jan. 11, 2018

Related U.S. Application Data

(63) Continuation of application No. 15/240,264, filed on Aug. 18, 2016, now Pat. No. 9,786,815, which is a continuation of application No. 14/098,643, filed on Dec. 6, 2013, now Pat. No. 9,425,362.

(30) Foreign Application Priority Data

Dec. 7, 2012 (TW) .............................. 101146337 A

(51) Int. Cl.
*H01L 33/44* (2010.01)
*H01L 33/38* (2010.01)
*H01L 33/42* (2010.01)
*H01L 33/22* (2010.01)
*H01L 33/00* (2010.01)

(52) U.S. Cl.
CPC .............. *H01L 33/38* (2013.01); *H01L 33/22* (2013.01); *H01L 33/42* (2013.01); *H01L 33/44* (2013.01); *H01L 33/002* (2013.01); *H01L 2933/0025* (2013.01)

(58) Field of Classification Search
CPC ................................................ H01L 33/00–62
See application file for complete search history.

(56) References Cited

U.S. PATENT DOCUMENTS

| 5,684,818 | A | 11/1997 | Anayama et al. |
| 5,764,673 | A | 6/1998 | Kawazu et al. |
| 6,566,155 | B1 * | 5/2003 | Numai ................ G01C 19/721 438/31 |

(Continued)

FOREIGN PATENT DOCUMENTS

| CN | 1148734 A | 4/1997 |
| CN | 1976067 A | 6/2007 |

(Continued)

*Primary Examiner* — Shaun M Campbell
*Assistant Examiner* — Suberr L Chi
(74) *Attorney, Agent, or Firm* — Ditthavong & Steiner, P.C.

(57) ABSTRACT

A method of manufacturing a light-emitting device includes: providing a substrate; forming a light-emitting structure comprising an active layer on the substrate; forming a protective layer having a first thickness on the light-emitting structure; etching the protective layer such that the protective layer has a second thickness less than the first thickness; and patterning the protective layer.

16 Claims, 9 Drawing Sheets

(56) References Cited

U.S. PATENT DOCUMENTS

| | | |
|---|---|---|
| 7,973,470 B2 | 7/2011 | Cok |
| 8,044,439 B2 | 10/2011 | Sakamoto et al. |
| 8,450,767 B2 | 5/2013 | Fu et al. |
| 8,461,618 B2 | 6/2013 | Mizogami et al. |
| 8,471,242 B2 | 6/2013 | Kim et al. |
| 9,048,451 B2 | 6/2015 | Yokoyama |
| 2003/0031220 A1 | 2/2003 | Takeuchi et al. |
| 2004/0118825 A1 | 6/2004 | Eliashevich et al. |
| 2007/0166861 A1* | 7/2007 | Jeon ............... H01L 33/44 438/39 |
| 2009/0026469 A1 | 1/2009 | Yamamoto |
| 2012/0080668 A1 | 4/2012 | Seki |
| 2012/0153255 A1 | 6/2012 | Kim et al. |
| 2012/0199861 A1 | 8/2012 | Tsuji |
| 2012/0228651 A1* | 9/2012 | Horng ............. H01L 25/0753 257/93 |
| 2012/0248490 A1 | 10/2012 | Weng et al. |
| 2012/0267673 A1 | 10/2012 | Okabe et al. |
| 2012/0319149 A1* | 12/2012 | Su ................. H01L 33/0095 257/98 |
| 2013/0026519 A1 | 1/2013 | Huang et al. |
| 2014/0061659 A1* | 3/2014 | Teplik ............. H01L 29/402 257/76 |
| 2014/0175485 A1 | 6/2014 | Liao et al. |
| 2014/0231849 A1 | 8/2014 | Song et al. |
| 2015/0108525 A1 | 4/2015 | Chae et al. |
| 2015/0108528 A1 | 4/2015 | Chae et al. |
| 2016/0079565 A1 | 3/2016 | Maindron et al. |
| 2016/0164024 A1 | 6/2016 | Takamuki |

FOREIGN PATENT DOCUMENTS

| | | |
|---|---|---|
| CN | 101322256 A | 12/2008 |
| CN | 101789478 A | 7/2010 |
| CN | 101944563 A | 1/2011 |
| CN | 102299218 A | 12/2011 |
| CN | 102339921 A | 2/2012 |
| JP | 2007123436 A | 5/2007 |

\* cited by examiner

METHOD OF MAKING A LIGHT EMITTING DEVICE HAVING A PATTERNED PROTECTIVE LAYER

RELATED APPLICATION

This application a continuation application of U.S. patent application Ser. No. 15/240,264, entitled "LIGHT EMITTING DEVICE", filed on Aug. 18, 2016, which is a continuation application of U.S. patent application Ser. No. 14/098,643, entitled "LIGHT EMITTING DEVICE", filed on Dec. 6, 2013, now U.S. Pat. No. 9,425,362, which claims priority from previously filed Taiwan Patent Application No. 101146337 filed on Dec. 7, 2012, entitled as "METHOD OF MAKING A LIGHT EMITTING DEVICE AND LIGHT EMITTING DEVICE MADE THEREOF", and the entire contents of which are hereby incorporated by reference herein in its entirety.

BACKGROUND

Technical Field

The present disclosure relates to a method of making a light-emitting device and in particular to a method of etching a protective layer.

Description of the Related Art

The light-emitting diodes (LEDs) of the solid-state lighting elements have the characteristics of the low power consumption, low heat generation, long operational life, shockproof, small volume, quick response and good opto-electrical property like light emission with a stable wavelength so the LEDs have been widely used in household appliances, indicator light of instruments, and opto-electrical products, etc.

Generally speaking, the method of making a light-emitting diode comprises many lithography processes and each of the processes comprises complicated steps. How to reduce the steps of processes and decrease the cost is an important issue.

Besides, light-emitting diodes can be further combined with a sub-mount to form a light emitting device, such as a bulb. The light-emitting device comprises a sub-mount with circuit; a solder on the sub-mount fixing the light-emitting diode on the sub-mount and electrically connecting the base of the light-emitting diode and the circuit of the sub-mount; and an electrical connection structure electrically connecting the electrode pad of the light-emitting diode and the circuit of the sub-mount; wherein the above sub-mount can be a lead frame or a large size mounting substrate for designing circuit of the light-emitting device and improving its heat dissipation.

SUMMARY OF THE DISCLOSURE

A method of manufacturing a light-emitting device includes: providing a substrate; forming a light-emitting structure comprising an active layer on the substrate; forming a protective layer having a first thickness on the light-emitting structure; etching the protective layer such that the protective layer has a second thickness less than the first thickness; and patterning the protective layer.

DETAILED DESCRIPTION OF THE EMBODIMENTS

The drawings illustrate the embodiments of the application and, together with the description, serve to illustrate the principles of the application. The same name or the same reference number given or appeared in different paragraphs or figures along the specification should has the same or equivalent meanings while it is once defined anywhere of the disclosure. The thickness or the shape of an element in the specification can be expanded or narrowed. It is noted that the elements not drawn or described in the figure can be included in the present application by the skilled person in the art.

FIGS. 1A-1G show figures of a method of manufacturing a light-emitting device 100 in accordance with an embodiment of the present disclosure.

Figure 1A:
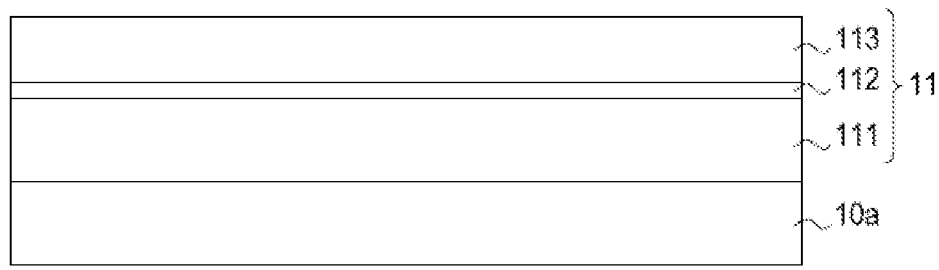
FIGS. 1A-1H show a cross-sectional view of a method of manufacturing a light-emitting device in accordance with an embodiment of the present disclosure.
Figure 1B:
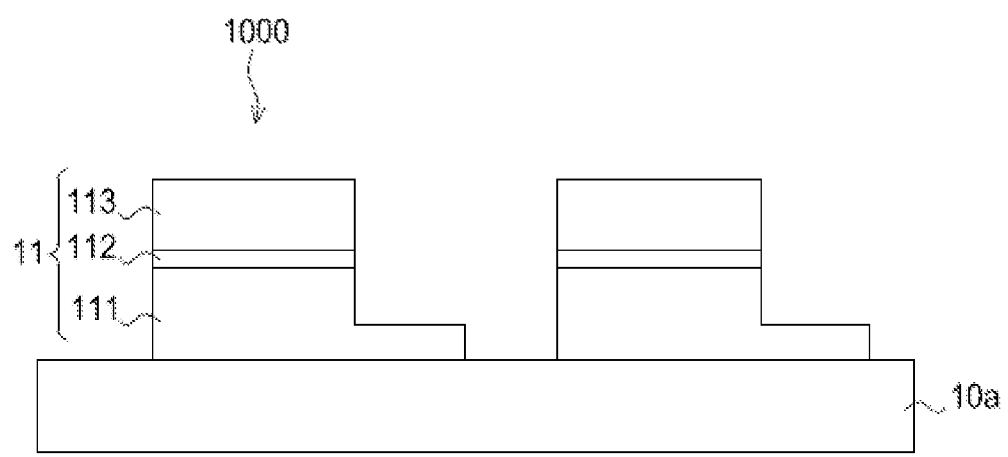
Figure 1C:
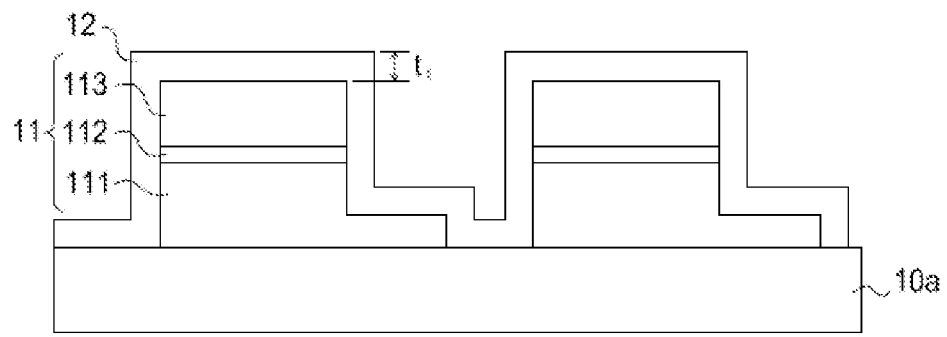
Figure 1D:
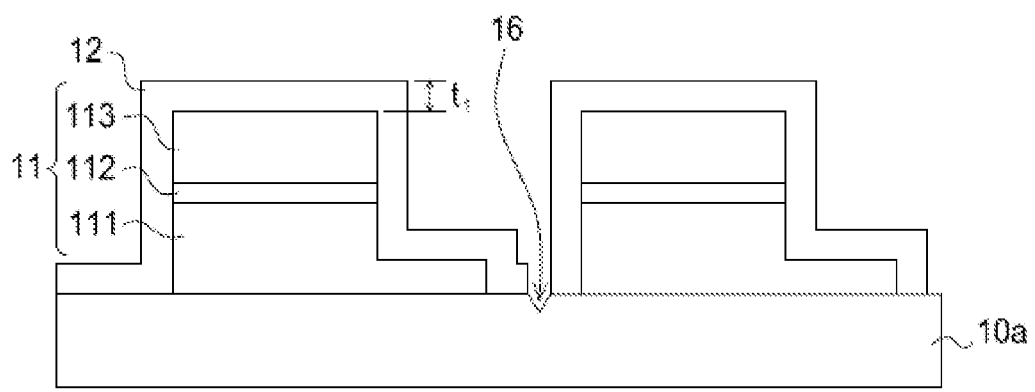
Figure 1E:
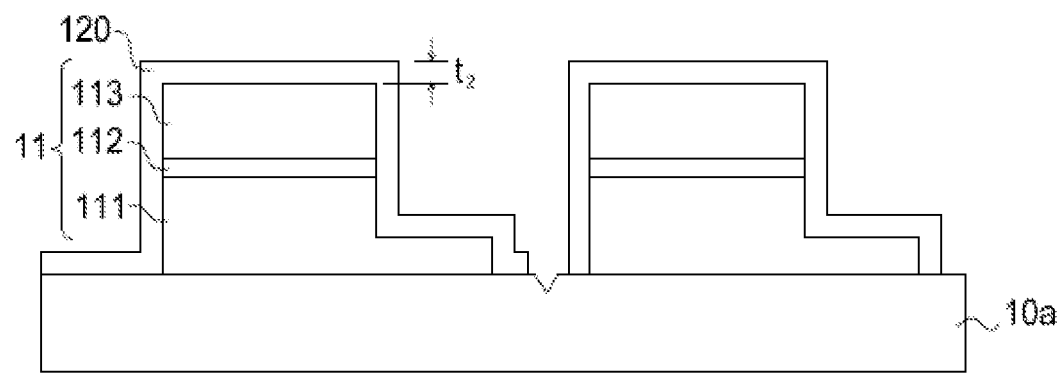
Figure 1F:
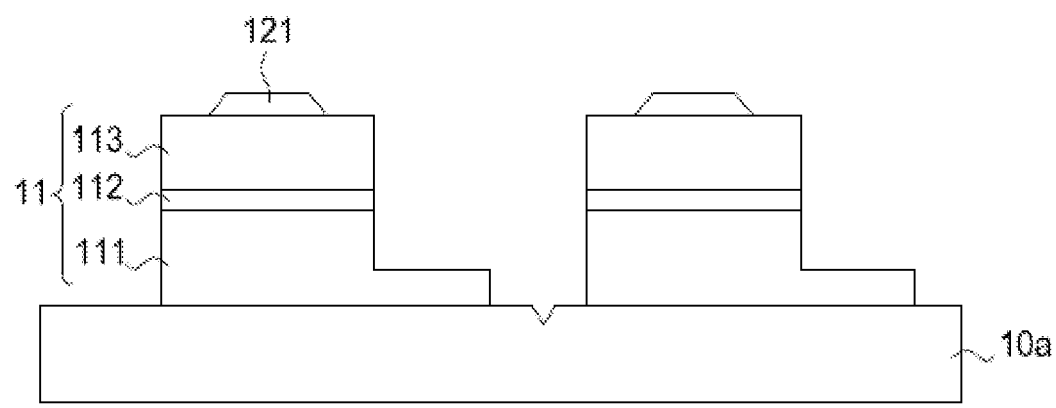
Figure 1G:
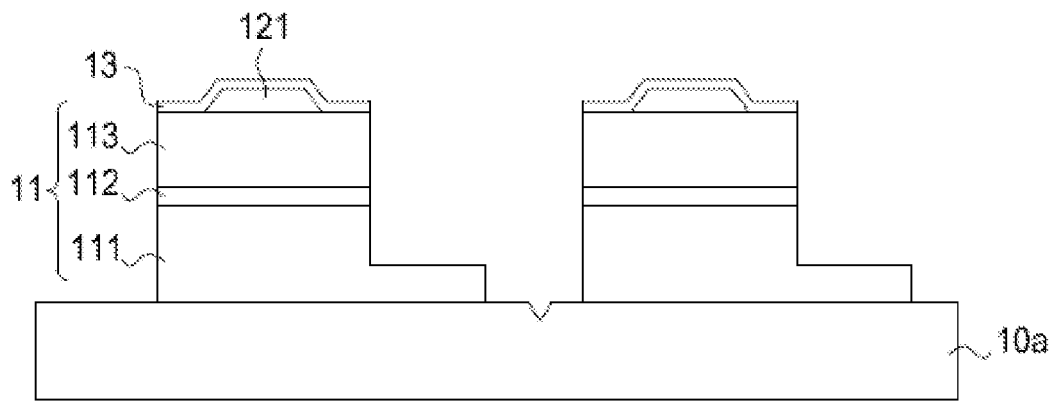
Figure 1H:
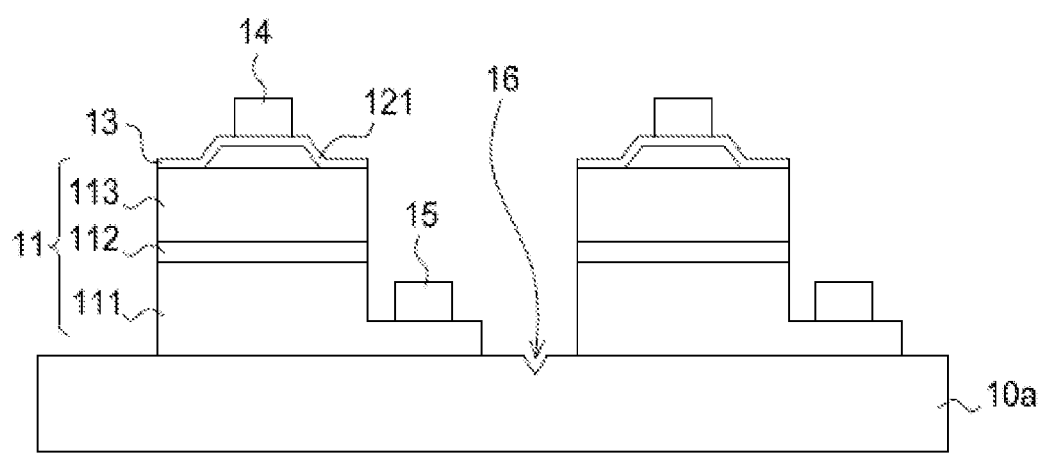

As shown in FIG. 1A, a substrate 10a is provided and a light-emitting structure 11 is formed on the substrate 10a. In this embodiment, the substrate 10a is a sapphire wafer substrate. The light-emitting structure 11 sequentially comprises a first type semiconductor layer 111, an active layer 112, and a second semiconductor layer 113 on the substrate. The first type semiconductor layer 111 and the second semiconductor layer 122 can be a cladding layer or a confinement layer separately provides an electron and a hole to be combined with each other in the active layer 112 and emits a light. As shown in FIG. 1B, etching the active layer 112 and the second type semiconductor layer 113 to from a plurality of light-emitting structures 1000. A plurality of the light-emitting structures 1000 are spaced arranged on the substrate 10a and expose a part of the first semiconductor layer 111. Besides, the light-emitting device 100 is a horizontal type structure but can also be a vertical type structure or other type structure. As shown in FIG. 1C, a protection layer 12 is formed to cover the first type semiconductor layer 111, the active layer 112, the second type semiconductor layer 113 and the substrate 10a. The protective layer 12 has a first thickness $t_1$ and is configured to protect the light-emitting structure 11 during the following etching process. In this embodiment, the first thickness $t_1$ is between 3300-10000 Å. As shown in FIG. 1D, a laser is applied to cut the substrate 10 to form a trench 16 in the substrate 10, wherein the cross section of the trench 16 is a triangle. It is noted that byproducts are generated when using a laser to cut the substrate 10, and an etching step is applied to remove the byproducts. However, the protective layer 12 is also etched while etching the byproducts. Therefore, as shown in FIG. 1E, the protective layer 120 has a second thickness $t_2$ between 3000-9700 Å after etching the byproducts and the second thickness t2 is less than the first thickness $t_1$. The difference between the first thickness $t_1$ and the second thickness $t_2$ is larger than 300 Å. In this embodiment, the method of etching the byproducts and etching the protective layer 12 at the same time comprises using an acidic solution to etch the byproducts and the protective layer 12. The acidic solution comprises a mixture solution of a phosphoric acid solution and a sulfuric acid solution, wherein a ratio between the sulfuric acid and the phosphoric acid is about 3:1. In another embodiment, the acidic solution is a phosphoric acid solution. As shown in FIG. 1F, the protective layer 120 is patterned to be a patterned protective layer 121. In this embodiment, the patterned protective layer 121 is also configured to be a current barrier layer 121. As shown in FIG. 1G, a transparent conductive layer 13 is formed on the barrier layer 121 and the second semiconductor layer 113. As shown in FIG. 1H, a first electrode 14 is formed on the transparent conductive layer 13 at the position corresponding to the barrier layer 121 and a second electrode 15 is formed on the first type semiconductor layer 111. The protective layer 121 or the barrier layer 121 is an insulating material and has a transmittance larger than 90%. Besides, the barrier layer 121 has a resistance larger than $10^{14}$ Ω-cm. The barrier layer 121 comprises silicon oxide ($SiO_2$), silicon nitride ($SiN_x$) or titanium dioxide ($TiO_2$). Then, splitting the light-emitting structure 1000 along the trench 16 to form a plurality of light-emitting devices 100.

Figure 2A:
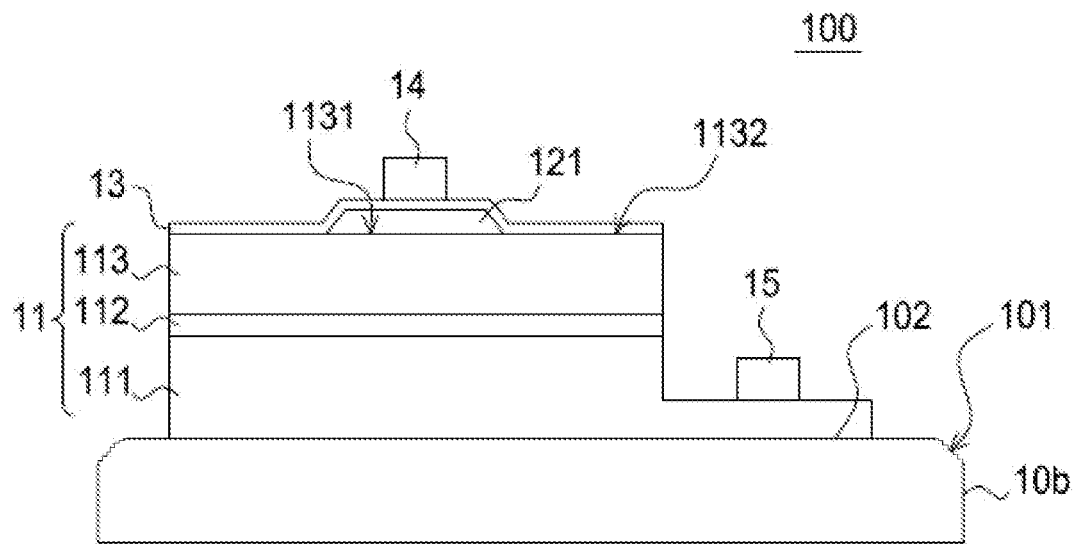
FIG. 2A shows a light-emitting device in accordance with an embodiment according to the manufacturing method of the present disclosure.
Figure 2B:
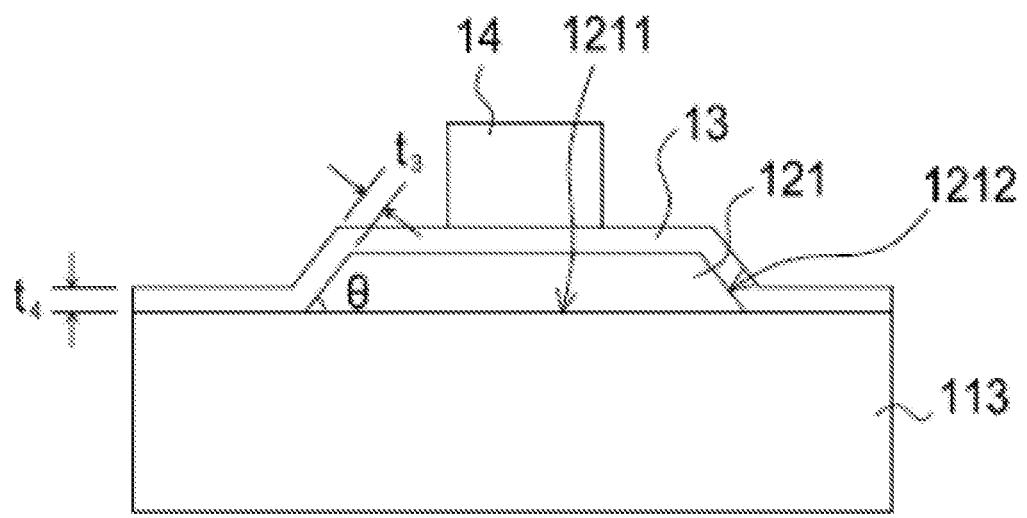
FIG. 2B shows a partial enlarged drawing of FIG. 2A.

FIG. 2A shows a light-emitting device 100 based on the method described in FIGS. 1A-1H. FIG. 2B shows a partial enlarged drawing of FIG. 2A. The light-emitting structure 11 is formed on the substrate 10b. The light-emitting structure 11 sequentially comprises a first type semiconductor layer 111, an active layer 112, and a second type semiconductor layer 113. The second type semiconductor layer 113 comprises a first region 1131 and a second region 1132. A barrier layer 121 is formed on the first region 1131 and has a lower surface 1211 and a side wall 1212 which is inclined against the lower surface 1211 and an angle (Θ) between the sidewall and the bottom surface is between 10°-70°. A transparent conductive layer 13 is formed on the side wall 1212 of the barrier layer 121 and has a third thickness ($t_3$); the transparent conductive layer 13 is also formed on the second region 1132 of the second semiconductor layer 113 and has a fourth thickness ($t_4$). Since the angle (Θ) between the sidewall 1212 and the lower surface 121 is less than 70°, the transparent conductive layer 13 can cover the side wall 1212 of the barrier layer 121 and the second region 1132 of the second semiconductor layer 113 uniformly. In this embodiment, a difference ($t_3-t_4$) between the thickness of the transparent conductive layer 13 formed on the sidewall 1212 of the barrier layer 121 and the thickness of the transparent conductive layer 13 formed on the second region 1132 of the second semiconductor layer 113 and the thickness ($t_3$) of the transparent conductive layer 13 formed on the side wall 1212 of the barrier layer 121 forms a ratio (($t_3-t_4$)/$t_3$) less than 10%. Besides, since a trench 16 of a triangular shape (referring to FIG. 1D) is formed in the substrate 10a when applying a laser, an inclined sidewall 101 of the substrate 10b is formed while splitting the light-emitting structures 1000 to form a light-emitting device 100. The inclined sidewall 101 is inclined against an upper surface 102 of the substrate 10b and an angle between the inclined sidewall 101 and the upper surface 102 of the upper surface 102 is larger than 90°. Moreover, an acidic solution is used to remove the byproducts generated by laser cutting after the inclined sidewall 101 is cut by laser so that the inclined sidewall 101 has a rough surface.

Figure 3A:
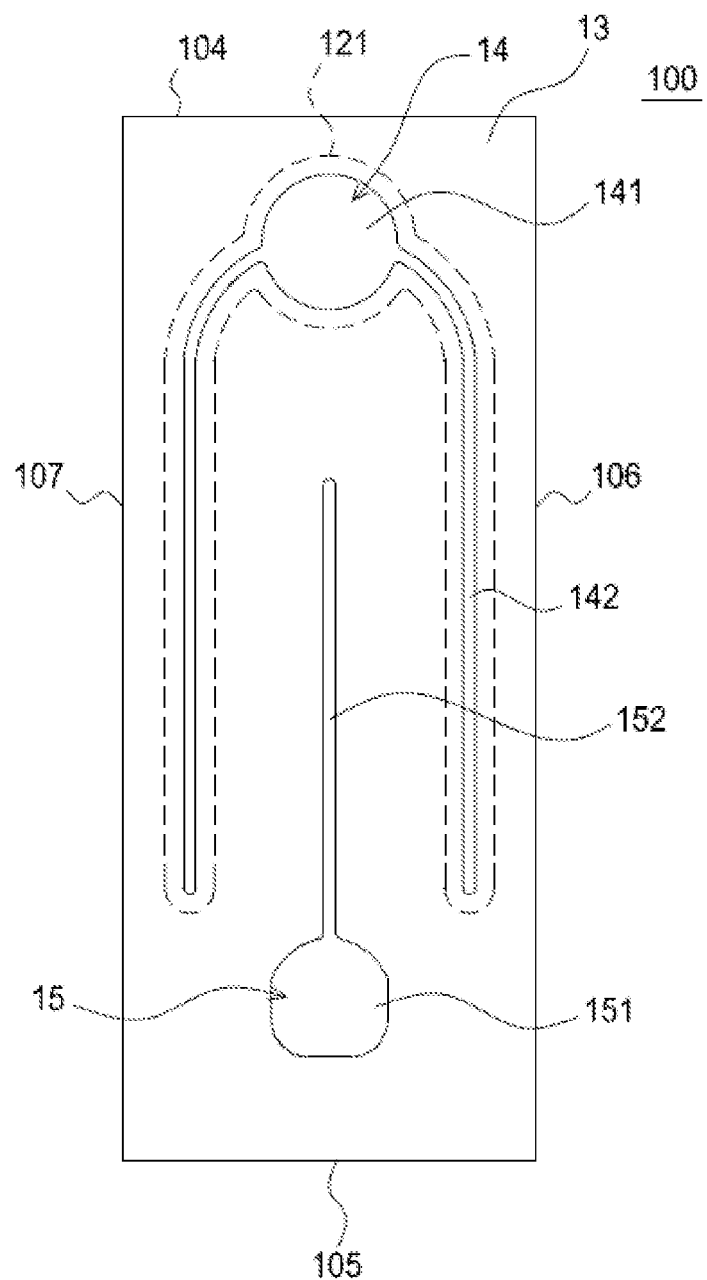
FIGS. 3A-3C show top views of light-emitting devices in accordance with embodiments of the present disclosure.
Figure 3B:
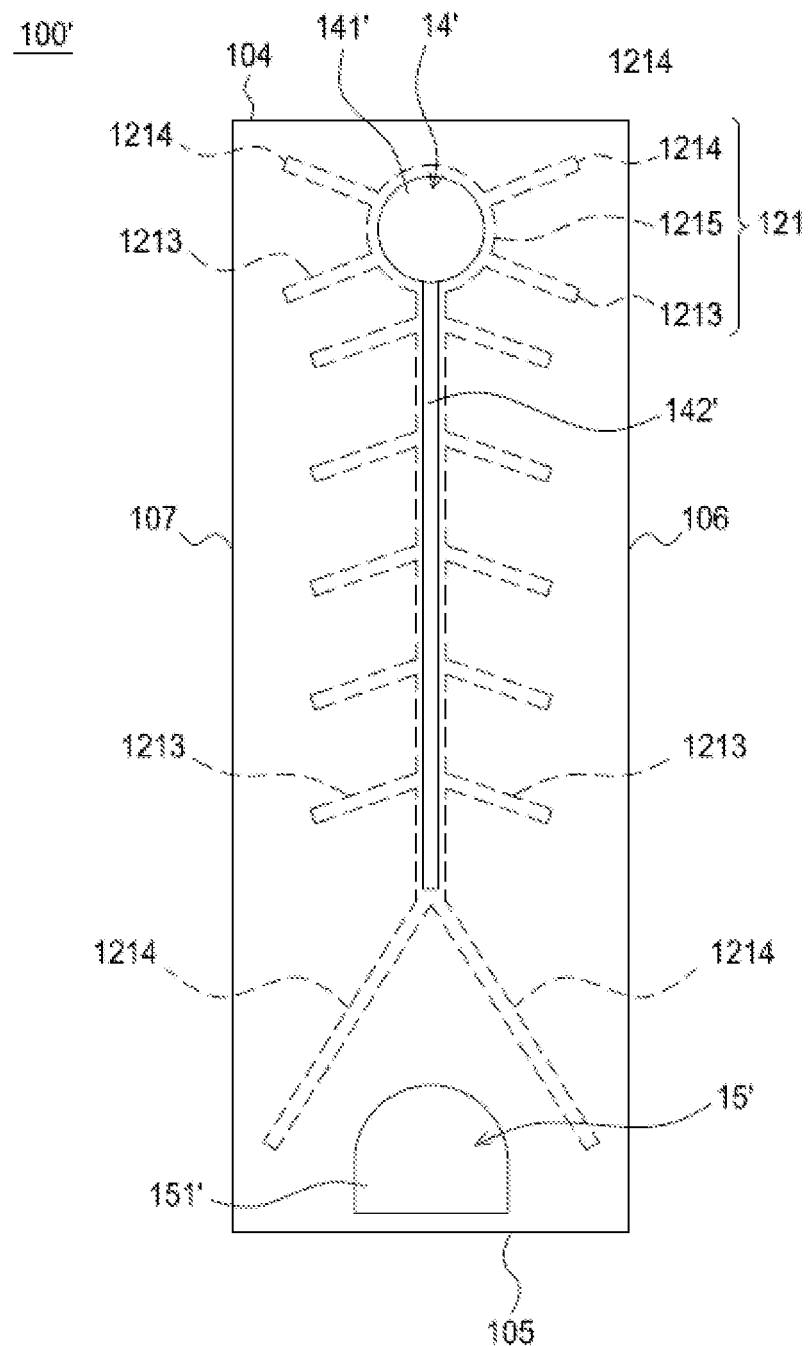
Figure 3C:
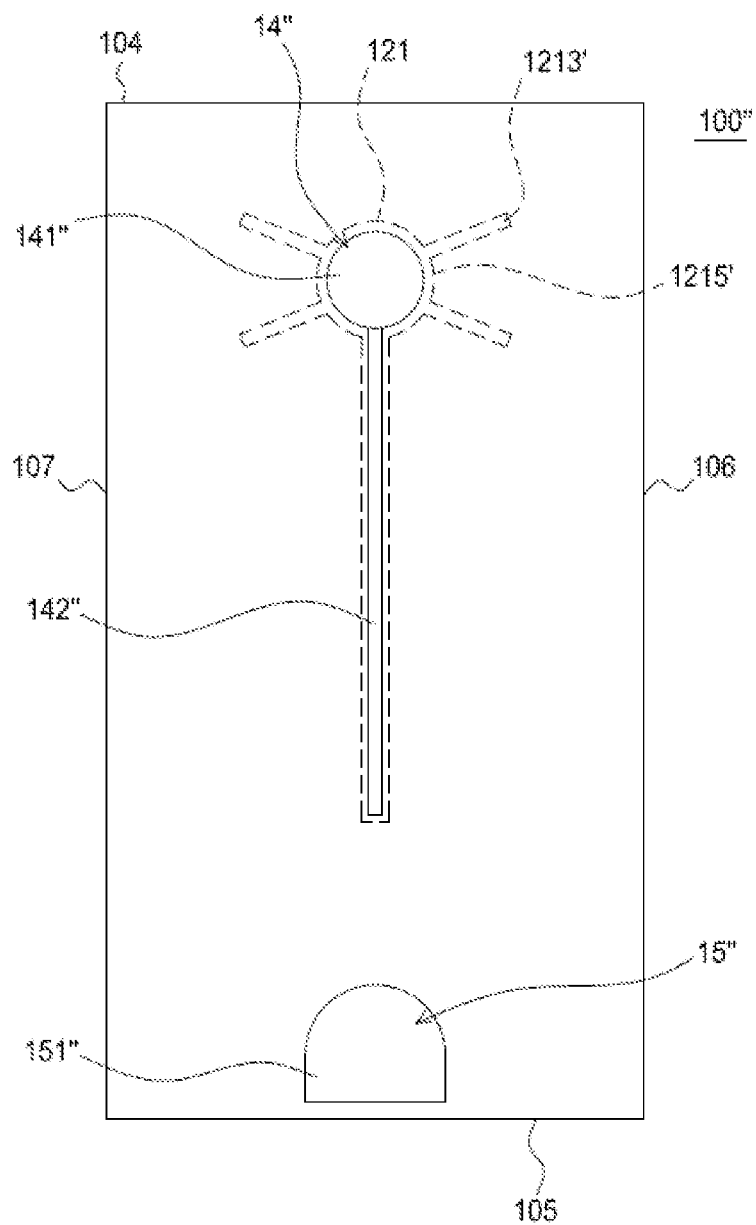

FIGS. 3A-3C show top views of light-emitting devices 100, 100' and 100". The light-emitting device 100, 100' or 100" has a rectangular shape and has a first side 104, a second side 105, a third side 106, and a fourth side 107. As shown in FIG. 3A, the light-emitting device 100 has a first electrode 14 near the first side 104 and the first electrode 14 is formed at the position on the transparent conductive layer 13 opposing to the barrier layer 121. In this embodiment, the first electrode 14 has a shape substantially the same as that of the barrier layer 121. The first electrode 14 comprises a first electrode pad 141 and a plurality of first extended electrodes 142 extending from the first electrode pad 141. The area of the barrier layer 121 is larger than the area of the electrode pad 141 and the extended electrode 142. The light-emitting device 100 further comprises a second electrode 15 near the second side 105 opposing to the first side 104. The second electrode 15 comprises a second electrode pad 151 and a second extended electrode 152 extending to the first side 104 while a first extended electrode 142 extends from the first electrode pad 141 to the second electrode pad 151 (in a direction toward the second side 105). Besides, the first electrode pad 141 can also be placed at a corner near the first side 104 and the third side 106, the second electrode pad 151 can also be placed at a corner near the second side 105 and the fourth side 107, and the second extended electrode 152 extends toward the first electrode pad 141. In another embodiment, as shown in FIG. 3B, the light-emitting device 100' comprises a first electrode 14' and a second electrode 15'. The first electrode 14' comprises a first electrode pad 141' and a first extended electrode 142'. The second electrode 15' comprises a second electrode pad 151'. The first extended electrode 142' extends in a direction from the first electrode pad 141' to the second electrode pad 151'. Besides, a barrier layer 121 comprises an electrode region 1215, a plurality of first extension regions 1213, and a plurality of second extension regions 1214. The electrode region 1215 of the barrier layer 121 is formed on the region corresponding to the region of the first electrode 14' and has a shape substantially the same as the first electrode 14' and an area larger than that of the first electrode 14'. The first extension region 1213 extends from the electrode region 1215 (the first electrode pad 141' and the first extend electrode 142') to the side wall (the third side 106 and the fourth side 107). In this embodiment, four second extension regions 1214 extend forward (in a direction to the first side 104) and backward (in a direction to the second side 105) form the electrode region 1215 (the first electrode pad 141' and the first extend electrode 142'). The first electrode 14' is not formed on the first extension region 1213 and the second extension region 1214.

As shown in FIG. 3C, in another embodiment, the light-emitting device 100" comprises a first electrode 14" and a second electrode 15". The first electrode 14" comprises a first electrode pad 141" and a first extended electrode 142". The second electrode 15" comprises a second electrode pad 151". The first extended electrode 142" extends in a direction from the first electrode pad 141" to the second electrode pad 151". Besides, a barrier layer 121 comprises an electrode region 1215' and a plurality of extension regions 1213'. The electrode region 1215' of the barrier layer 121 is formed on the region corresponding to that of the first electrode 14" and has a shape substantially the same as the first electrode 14" and an area larger than that of the first electrode 14". A plurality of extension regions 1213' extends from the electrode region 1215' (the first electrode pad 141" and the first extend electrode 142") to four sides (104, 105, 106, and 107) at an angle of 45°. The first electrode 14" is not formed on the extension region 1213'.

The first type semiconductor layer can be an n-type semiconductor and the second type semiconductor layer can be a p-type semiconductor. The first type semiconductor layer and the second semiconductor layer comprise AlGaAs, AlGaInP, AlInP, InGaP, AlInGaN, InGaN, AlGaN and GaN. Optionally, the first type semiconductor layer can be a p-type semiconductor layer and the second type semiconductor layer can be an n-type semiconductor layer. The active layer comprises AlGaAs, AlGaInP, InGaP, AlInP, AlInGaN, InGaN, AlGaN and GaN. The active layer can be a single heterostructure (SH), a double-side double heterostructure (DDH) or a multi-quantum well (MQW) structure. The substrate comprises GaAs, GaP, Ge, sapphire, glass, diamond, SiC, Si, GaN, and ZnO or other substitution material.

Figure 4:
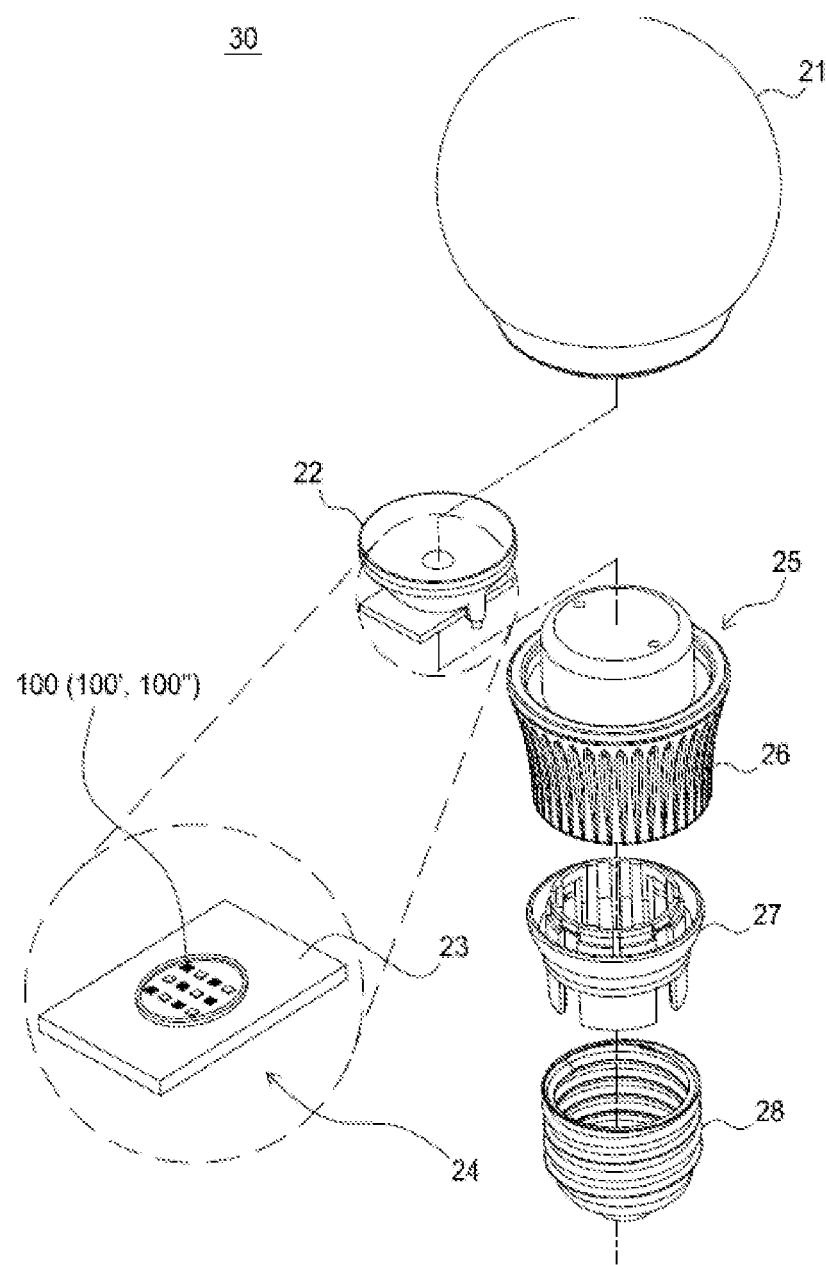
FIG. 4 shows an exploded drawing of a bulb in accordance with an embodiment of the present disclosure.

FIG. 4 shows an exploded drawing of a bulb 30 in accordance with an embodiment of the present disclosure. The bulb 30 comprises a cover 21, a lens 22, a light emitting module 24, a substrate 25, a heat-dissipation element 26, a connection element 27, and a circuit element 28. The light emitting module 24 comprises a carrier 23 and a plurality of light-emitting devices. The light-emitting device can be any of the light-emitting device 100 (100' and 100") mentioned above. As shown in FIG. 4, for example, twelve light-emitting devices are placed on the carrier 23 comprising six red light light-emitting devices and six blue light light-emitting devices arranged staggered and electrically connected to each other (in series or in parallel). The blue light light-emitting device comprises a phosphor device formed above to convert the light emitted from the blue light light-emitting device. The light emitted by the blue light light-emitting device and the converted light are mixed to be a white light which is matched with a red light light-emitting device to emit a warm white light having a color temperature between 2400-3000K.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A method of making a light emitting device, comprising steps of:
    providing a substrate;
    forming a light-emitting structure comprising an active layer on the substrate;
    forming a protective layer having a first thickness on the light-emitting structure;
    etching the protective layer to form a protective thin layer having a second thickness smaller than the first thickness; and
    patterning the protective thin layer.

2. The method of claim 1, wherein the protective layer is formed on a top surface and a sidewall of the light-emitting structure.

3. The method of claim 1, wherein a difference between the first thickness and the second thickness is larger than 300 Å.

4. The method of claim 1, further comprising applying a laser after forming the protective layer.

5. The method of claim 4, further comprising cutting the protective layer by the laser.

6. The method of claim 4, further comprising forming a trench in the substrate by the laser.

7. The method of claim 1, wherein the step of etching the protective layer comprises etching the protective layer by an acidic solution.

8. The method of claim 1, wherein the second thickness is between 3000-9700 Å.

9. The method of claim 1, wherein a patterned protective layer is formed by the step of patterning the protective thin layer, and the method further comprising:
    forming a transparent conductive layer on the patterned protective layer and the light-emitting structure; and
    forming a first electrode on the transparent conductive layer.

10. The method of claim 9, wherein the first electrode is formed on the transparent conductive layer at a position corresponding to the patterned protective layer.

11. The method of claim 10, wherein the patterned protective layer comprises a shape substantially the same as the first electrode and an area larger than that of the first electrode.

12. The method of claim 9, wherein the patterned protective layer comprises an inclined sidewall.

13. The method of claim 9, wherein the patterned protective layer is configured to be a current barrier layer.

14. The method of claim 1, wherein the step of forming the light-emitting structure comprises:
    sequentially forming a first semiconductor layer, an active layer, and a second semiconductor layer on the substrate; and
    etching the light-emitting structure to expose a part of the first semiconductor layer before forming the protective layer.

15. The method of claim 14, further comprising forming a second electrode on the first semiconductor layer.

16. The method of claim 1, wherein the protective layer comprises an insulating material.

* * * * *